(12) United States Patent
Wang et al.

(10) Patent No.: US 12,119,053 B2
(45) Date of Patent: Oct. 15, 2024

(54) METHOD OF PROGRAMMING MLC MEMORY DEVICE AND RELATED MLC MEMORY DEVICE

(71) Applicant: UNITED MICROELECTRONICS CORP., Hsin-Chu (TW)

(72) Inventors: Chia-Wen Wang, Tainan (TW); Chien-Hung Chen, Hsin-Chu (TW); Chia-Hui Huang, Tainan (TW); Jen-Yang Hsueh, Tainan (TW); Ling-Hsiu Chou, Tainan (TW); Chih-Yang Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 204 days.

(21) Appl. No.: 17/680,264

(22) Filed: Feb. 24, 2022

(65) Prior Publication Data

US 2023/0238058 A1     Jul. 27, 2023

(30) Foreign Application Priority Data

Jan. 21, 2022   (TW) .................................. 111102526

(51) Int. Cl.
*G11C 16/10* (2006.01)
*G11C 11/56* (2006.01)
*G11C 16/34* (2006.01)
*G11C 16/04* (2006.01)

(52) U.S. Cl.
CPC .......... *G11C 11/5628* (2013.01); *G11C 16/10* (2013.01); *G11C 16/3427* (2013.01); *G11C 16/3459* (2013.01); *G11C 16/0483* (2013.01)

(58) Field of Classification Search
CPC . G11C 16/10; G11C 16/3427; G11C 16/3459; G11C 16/0483; G11C 11/5628
USPC ..................................... 365/185.03
See application file for complete search history.

(56) References Cited

U.S. PATENT DOCUMENTS

| 7,221,592 | B2 * | 5/2007 | Nazarian | G11C 16/0483 |
| | | | | 365/185.18 |
| 8,634,250 | B2 * | 1/2014 | Haratsch | G11C 16/10 |
| | | | | 365/185.28 |
| 8,659,966 | B2 * | 2/2014 | Choi | G11C 7/04 |
| | | | | 365/185.18 |
| 2020/0395088 | A1 * | 12/2020 | Cho | G11C 11/5628 |

FOREIGN PATENT DOCUMENTS

TW           111102526      *  1/2022

* cited by examiner

*Primary Examiner* — Alexander Sofocleous
*Assistant Examiner* — Tracy Hampton
(74) *Attorney, Agent, or Firm* — Winston Hsu (57) ABSTRACT

When programming an MLC memory device, the disturb characteristics of a program block having multiple memory cells are measured, and the threshold voltage variations of the multiple memory cells are then acquired based on the disturb characteristics of the program block. Next, multiple initial program voltage pulses are provided according to a predetermined signal level, and multiple compensated program voltage pulses are provided by adjusting the multiple initial program voltage pulses. Last, the multiple compensated program voltage pulses are outputted to the program block for programming the multiple memory cells to the predetermined signal level.

13 Claims, 8 Drawing Sheets

METHOD OF PROGRAMMING MLC MEMORY DEVICE AND RELATED MLC MEMORY DEVICE

BACKGROUND OF THE INVENTION

1. Field of the Invention

The present invention is related to a method of programming MLC memory device and related MLC memory device, and more particularly, to a method of improving program interferences when programming MLC memory device and related MLC memory device.

2. Description of the Prior Art

Semiconductor memory has become more popular for use in various electronic devices. For example, non-volatile memory (NVM) has the capability to hold saved data even if the power is turned off and is often applied in cellular telephones, digital cameras, personal digital assistants, mobile computing devices, non-mobile computing devices and other devices.

An NVM includes a plurality of memory cells, wherein each memory cell in a single-level cell (SLC) memory device stores a single bit of data and a multi-level cell (MLC) memory device can increase storage capacity by storing multiple bits of data in each memory cell. In an NVM device, the storage value (charge or voltage) of each memory cell represents the data stored in each memory cell. In MLC memory devices, for example, floating gate devices are employed with programmable threshold voltages in a range that is divided into multiple intervals with each interval corresponding to one or multiple bit values.

Figure 1A:
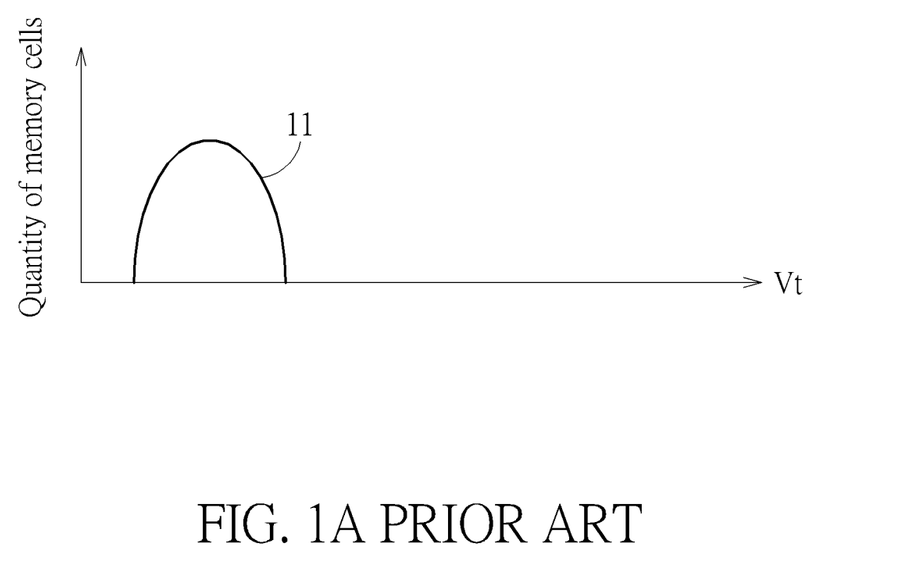
FIGS. 1A-1C are diagrams illustrating a prior art method of programing an MLC memory device.
Figure 1B:
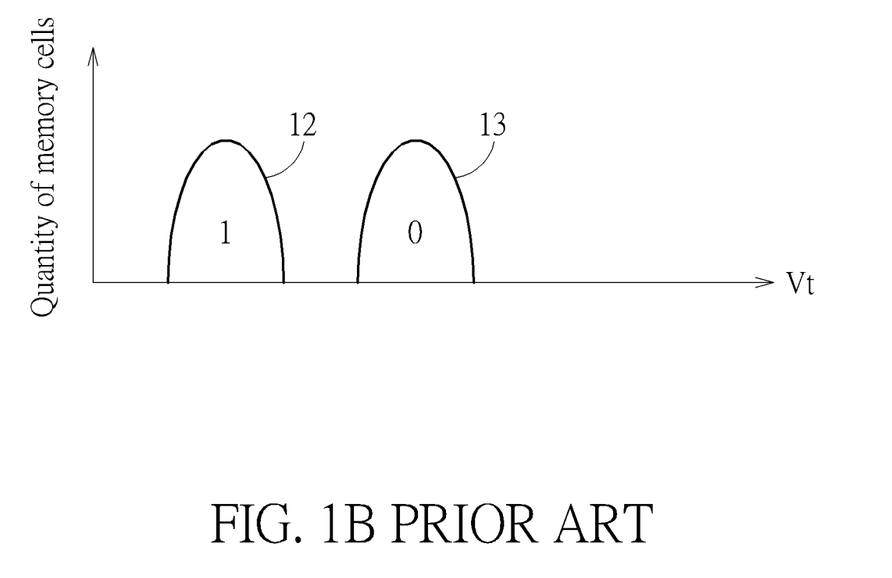
Figure 1C:
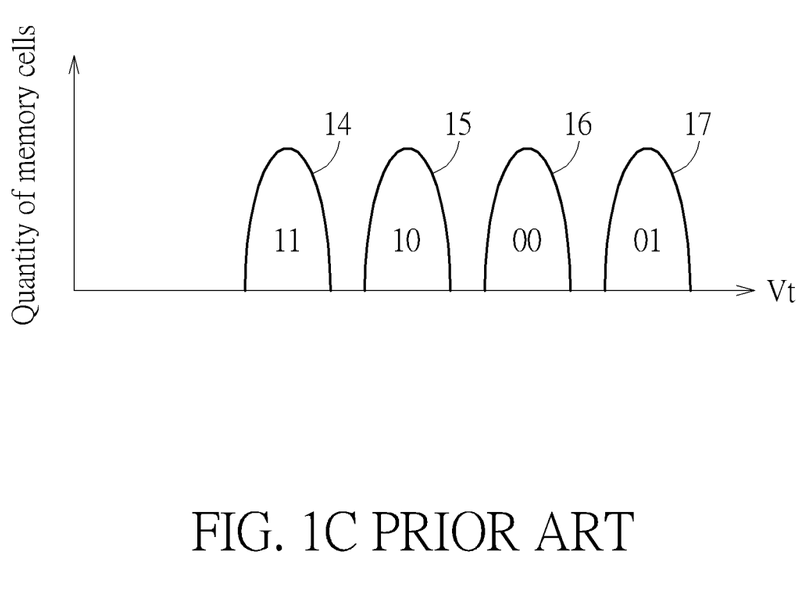

FIGS. 1A-1C are diagrams illustrating a prior art method of programing an MLC memory device. In the exemplary embodiment shown in FIG. 1, the prior art MLC memory device employs four possible data states by storing two bits of data in each memory cell, wherein each physical page can store an MSB page and an LSB page. The vertical axis represents the quantity of memory cells, and the horizontal axis represents the threshold voltage Vt of the memory cells. Curve 11 represents the threshold voltage distribution of the memory cells before the program operation, wherein all memory cells are in the initial unprogrammed state as depicted in FIG. 1A. Next, program voltages may be applied to the LSB page of the physical page so that the memory cells have two threshold voltage distributions, wherein curve 12 represents the threshold voltage distribution of the memory cells in the logic state 1 and curve 13 represents the threshold voltage distribution of the memory cells in the logic state 0, as depicted in FIG. 1B. Next, program voltages may be applied to the MSB page of the physical page so that the memory cells have four threshold voltage distributions, wherein curve 14 represents the threshold voltage distribution of the memory cells in the logic state 11, curve 15 represents the threshold voltage distribution of the memory cells in the logic state 10, curve 16 represents the threshold voltage distribution of the memory cells in the logic state 00, and curve 17 represents the threshold voltage distribution of the memory cells in the logic state 01, as depicted in FIG. 1C.

It is further noted that the memory cells are typically programmed using well-known incremental step pulse programming (ISPP) and program/verify techniques. Generally during a program/verify cycle, program voltage pulses with incremented levels are applied to a memory cell to store a charge in the memory cell transistor until a minimum target threshold voltage is exceeded. A verify voltage pulse may then be applied to the memory cell to verify whether the memory cell has been successfully programmed. When the threshold voltage of the memory cell exceeds the verify voltage pulse, the memory cell has been successfully programmed; when the threshold voltage of the memory cell does not exceed the verify voltage pulse, a program voltage pulse with a higher level is applied until the threshold voltage of the memory cell exceeds the verify voltage pulse.

Figure 2A:
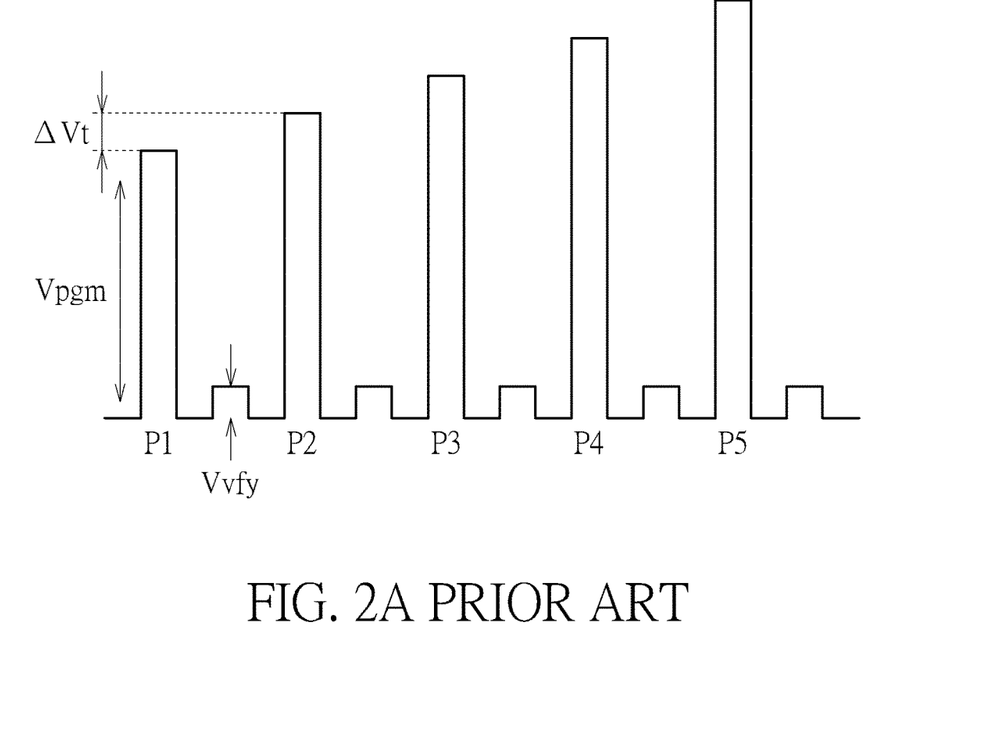
FIGS. 2A and 2B are diagrams illustrating a prior art ISPP programming method.
Figure 2B:
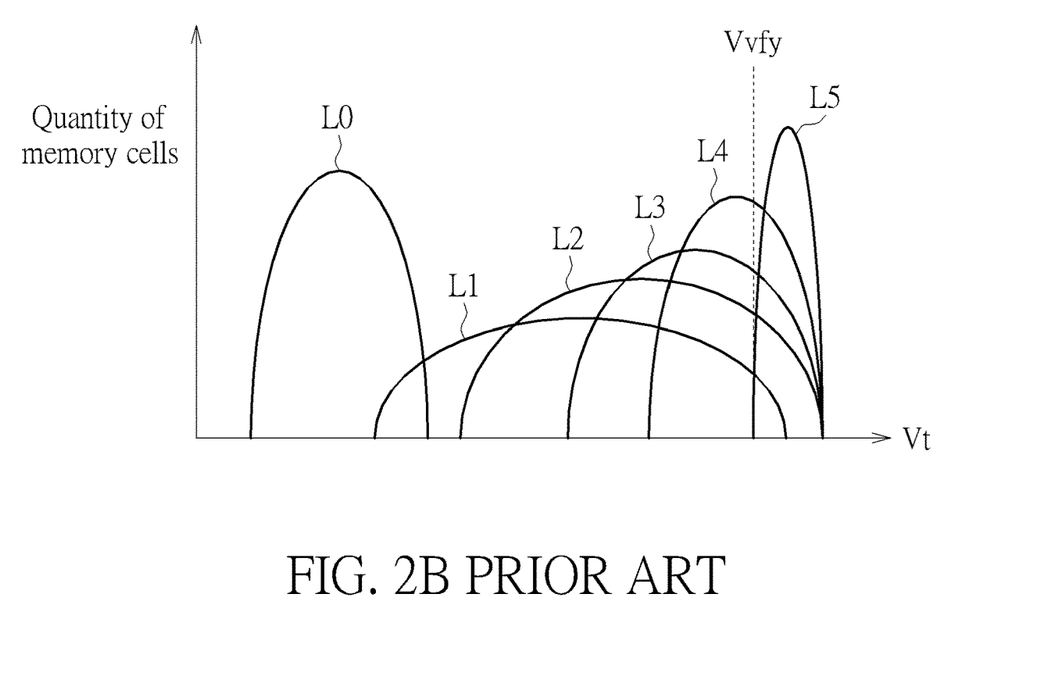

FIGS. 2A and 2B are diagrams illustrating a prior art ISPP programming method. As depicted in FIG. 2A, P1-P5 represent five program voltage pulses, wherein Vpgm is the initial program voltage value and $\Delta Vt$ is the voltage increment. In other words, $P1=Vpgm$, $P2=Vpgm+\Delta Vt$, $P3=Vpgm+2\Delta Vt$, $P4=Vpgm+3\Delta Vt$, and $P5=Vpgm+4\Delta Vt$. As depicted in FIG. 2B, L0 represents the threshold voltage distribution of the memory cells in the initial unprogrammed state, and L1-L5 represent the threshold voltage distributions of the memory cells after applying the program voltage pulses P1-P5, respectively. After applying the program voltage pulse P1, the memory cells have the threshold voltage distribution L1. Next, it is determined whether the threshold voltage distribution L1 of the memory cells is higher than the verify voltage pulse Vvfy, and the program voltage pulse P2 is applied to the memory cells whose threshold voltage does not exceed the verify voltage pulse Vvfy. The same step continues until the threshold voltage distribution L5 of the memory cells is higher than the verify voltage pulse Vvfy. However, when programing a memory cell using the prior art method, its neighboring memory cells may be affected and thus have increased threshold voltages. The above-mentioned inter-cell interferences may downgrade the reliability of the memory device.

SUMMARY OF THE INVENTION

The present invention provides a method of programing an MLC memory device. The method includes measuring a disturb characteristic of a program block in the MLC memory device, wherein the program block includes a plurality of memory cells; acquiring threshold voltage variations of the plurality of memory cells according to the disturb characteristic of the program block; determining a plurality of initial program voltage pulses associated with a predetermined signal level; providing a plurality of compensated program voltage pulses by adjusting the plurality of initial program voltage pulses according to the threshold voltage variations of the plurality of memory cells; and programming the plurality of memory cells to the predetermined signal level by outputting the plurality of compensated program voltage pulses to the program block.

The present invention further provides an MLC memory device which includes a memory device and a processing circuit. The memory array includes M columns and N rows of memory cells, wherein M and N are integers larger than 1. The processing circuit is configured to acquire threshold voltage variations of each row of memory cells among the N rows of memory cells according to a disturb characteristic of each row of memory cells; determine a plurality of initial program voltage pulses associated with a predetermined signal level for an operation to program an $n^{th}$ row of memory cells among the N rows of memory cells to the predetermined signal level, wherein n is a positive integer not larger than N; provide a plurality of compensated program voltage pulses by adjusting the plurality of initial program voltage pulses according to the threshold voltage variation of the n$^{th}$ row of memory cells; and program the n$^{th}$ row of memory cells to the predetermined signal level by outputting the plurality of compensated program voltage pulses to the n$^{th}$ row of memory cells.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
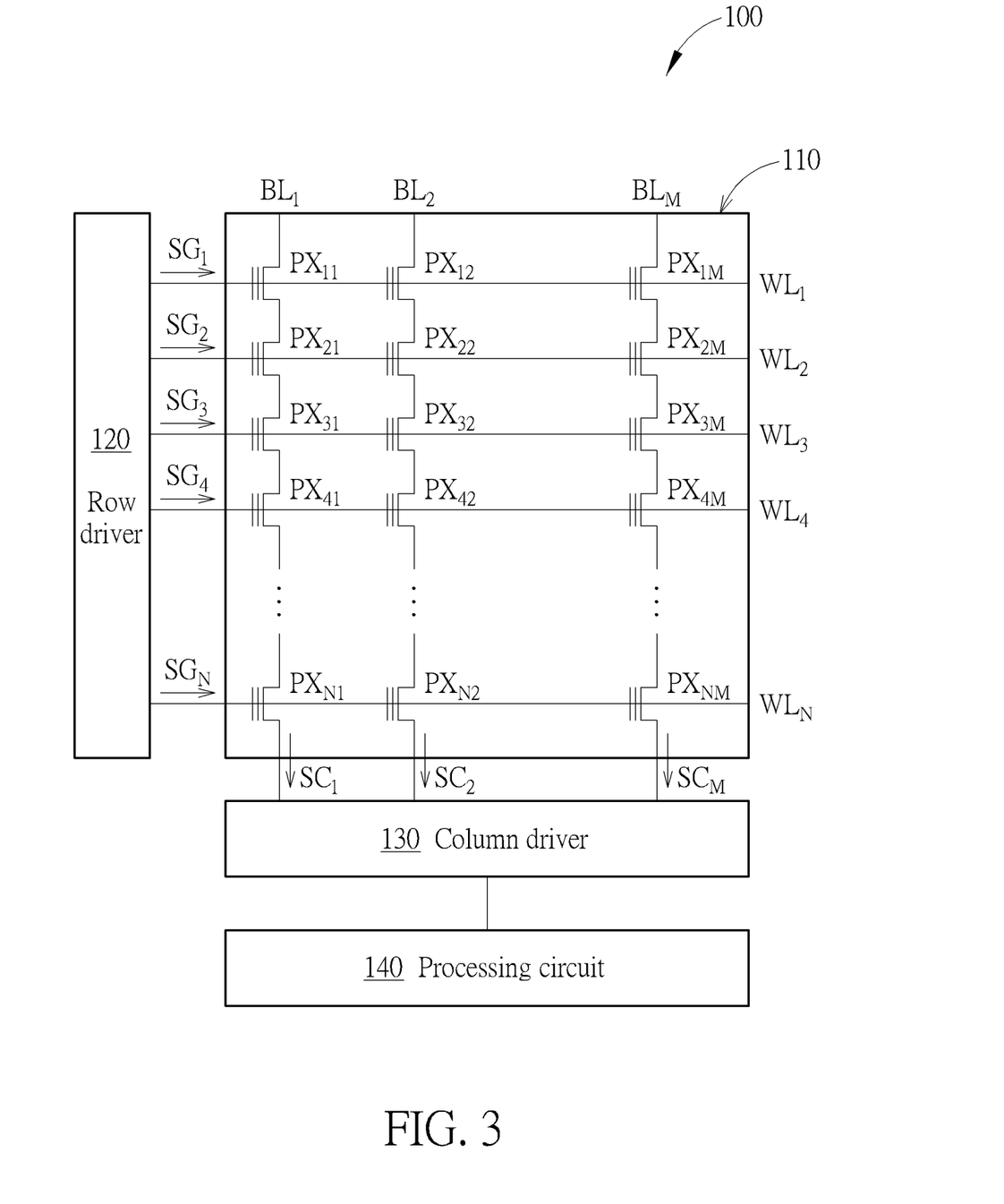
FIG. 3 is a functional block diagram illustrating a memory device according to an embodiment of the present invention.

FIG. 3 is a functional block diagram illustrating a memory device 100 according to an embodiment of the present invention. The memory device 100 includes a memory block 110, a row driver 120, a column driver 130, and a processing circuit 140. The memory block 110 includes a plurality of memory cells $PX_{11}$-$PX_{NM}$ arranged in an array, a plurality of word lines $WL_1$-$WL_N$, and a plurality of bit lines $BL_1$-$BL_M$, wherein M and N are integers larger than 1.

The processing circuit 140 is configured to control the row driver 120 for outputting row driving signals $SG_1$-$SG_N$ to the word lines $WL_1$-$WL_N$, thereby turning on corresponding rows of memory cells. The processing circuit 140 is configured to control the column driver 130 for outputting column driving signals $SC_1$-$SC_M$ to the bit lines $BL_1$-$BL_M$, thereby performing write, erase and program operations on corresponding memory cells.

In an embodiment of the present invention, the memory cells $PX_{11}$-$PX_{NM}$ may be non-volatile memory with MLC structure, such as flash memory, random access memory (RAM), programmable read only memory (PROM), or any combination thereof. However, the type of memory cells $PX_{11}$-$PX_{NM}$ does not limit the scope of the present invention.

Figure 4:
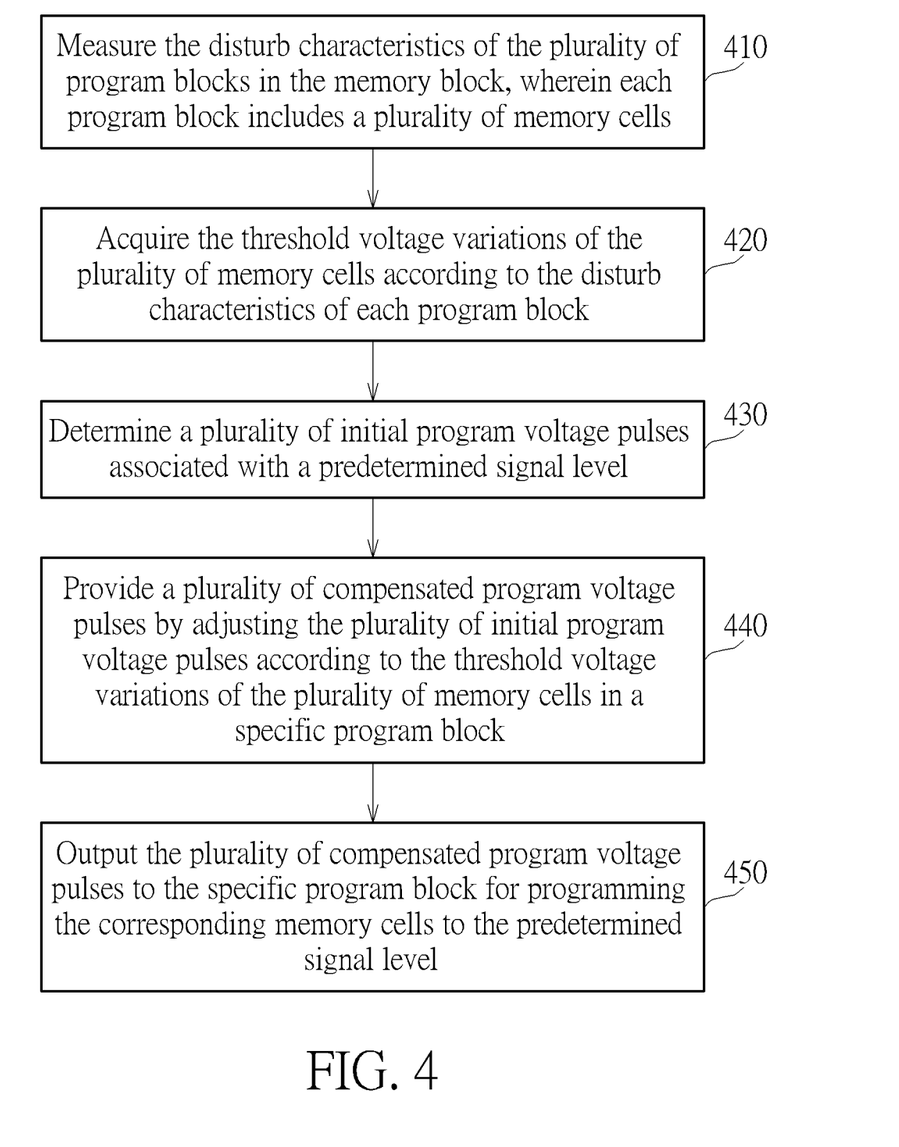
FIG. 4 is a flowchart illustrating a method of programing an MLC memory device according to an embodiment of the present invention.

FIG. 4 is a flowchart illustrating a method of programing an MLC memory device according to an embodiment of the present invention. The present method includes the following steps:

Step 410: measure the disturb characteristics of the plurality of program blocks in the memory block 110, wherein each program block includes a plurality of memory cells.

Step 420: acquire the threshold voltage variations of the plurality of memory cells according to the disturb characteristics of each program block.

Step 430: determine a plurality of initial program voltage pulses associated with a predetermined signal level.

Step 440: provide a plurality of compensated program voltage pulses by adjusting the plurality of initial program voltage pulses according to the threshold voltage variations of the plurality of memory cells in a specific program block.

Step 450: output the plurality of compensated program voltage pulses to the specific program block for programming the corresponding memory cells to the predetermined signal level.

In step 410, the disturb characteristics of the plurality of program blocks in the memory block 110 are first measured, wherein each program block includes a plurality of memory cells. In step 420, the threshold voltage variations of the plurality of memory cells are then acquired according to the disturb characteristics of each program block. In an embodiment, the memory block 110 includes N program blocks corresponding to the memory cells coupled to the word lines $WL_1$-$WL_N$, respectively. In an embodiment, the disturb characteristics of each program block is determined based on the predetermined program distribution of the memory cells coupled to each word line.

Figure 5:
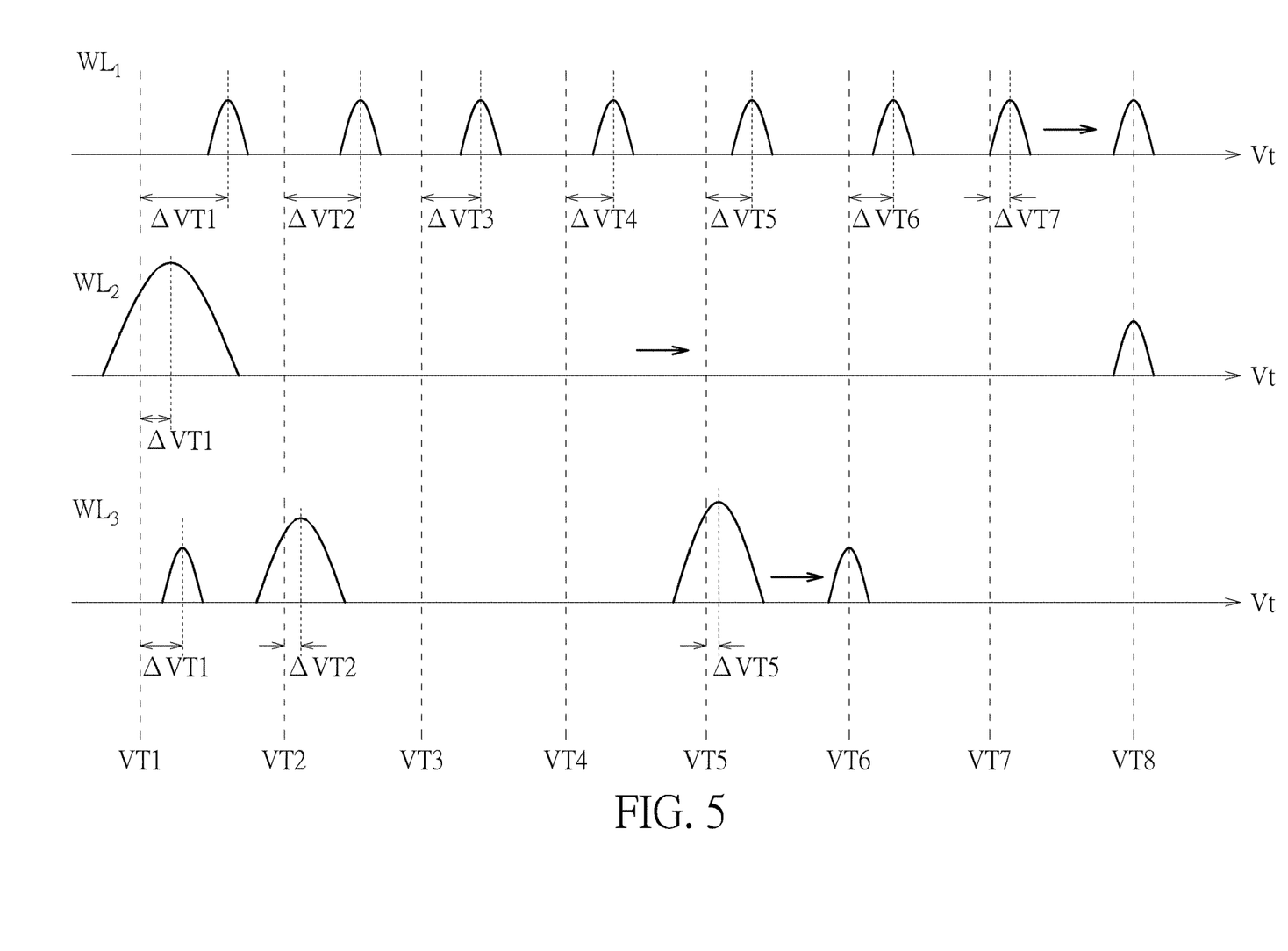
FIG. 5 is a diagram illustrating the disturb characteristics of the plurality of program blocks and the method of acquiring the threshold voltage variations thereof according to an embodiment of the present invention.

FIG. 5 is a diagram illustrating the disturb characteristics of the plurality of program blocks and the method of acquiring the threshold voltage variations thereof according to an embodiment of the present invention. For illustrative purpose, it is assumed that the memory cells are programmed to eight threshold voltages VT1-VT8 in the present ISPP programming sequence. For example, the row driver 120 is configured to output the row driving signal SG to the word lines $WL_1$-$WL_N$ for turning on the first row of memory cells $PX_{11}$-$PX_{1N}$, and the column driver 130 is configured to output the column driving signals $SC_1$-$SC_N$ to the bit lines $BL_1$-$BL_M$ sequentially. Assuming that the column driving signals $SC_1$-$SC_N$ include program voltage pulses having eight different levels similar to those depicted in FIG. 2A and that the first row of memory cells $PX_{11}$-$PX_{1N}$ are programmed to eight threshold voltages VT1-VT8 by the column driving signals $SC_1$-$SC_N$, the memory cells programmed to the threshold voltages VT1-VT7 may encounter different degrees of interferences which result in threshold voltage variations $\Delta VT1$-$\Delta VT7$, wherein $\Delta VT1 > \Delta VT2 > \ldots > \Delta VT7$. Assuming that the column driving signals $SC_1$-$SC_N$ include program voltage pulses having two different levels similar to those depicted in FIG. 2A and that the second row of memory cells $PX_{21}$-$PX_{2N}$ are programmed to two threshold voltages VT1 and VT8 by the column driving signals $SC_1$-$SC_N$, the memory cells programmed to the threshold voltage VT1 may encounter an interference which results in a threshold voltage variation $\Delta VT1$. Assuming that the column driving signals $SC_1$-$SC_N$ include program voltage pulses having four different levels similar to those depicted in FIG. 2A and that the third row of memory cells $PX_{31}$-$PX_{3N}$ are programmed to four threshold voltages VT1, VT2, VT5 and VT6 by the column driving signals $SC_1$-$SC_N$, the memory cells programmed to the threshold voltages VT1, VT2 and VT5 may encounter different degrees of interferences which result in threshold voltage variations $\Delta VT1$, $\Delta VT2$ and $\Delta VT5$, wherein $\Delta VT1 > \Delta VT2 > \Delta VT5$.

In step 430, the plurality of initial program voltage pulses associated with the predetermined signal level may be determined. In step 440, the plurality of compensated voltage pulses may be provided by adjusting the plurality of initial program voltage pulses according to the threshold voltage variations of the plurality of memory cells in the specific program block. The following Table 1 illustrates the method of executing steps 430 and 440 in the present invention. For illustrative purpose, it is also assumed that the memory cells are programmed to eight threshold voltages VT1-VT8 in the present ISPP programming sequence and that the column driving signals $SC_1$-$SC_N$ include program voltage pulses having eight different levels similar to those depicted in FIG. 2A. The peak values of the program voltage pulses P1'-P8' are shown in Table. 1, wherein Vpgm represents the initial program voltage value, ΔVt represents the voltage increment, and F(row1)-F(rowN) represent the threshold voltage variations of the memory cells in each program block.

TABLE 1

|  | First row ($WL_1$) | second row ($WL_2$) | ... | $N^{th}$ row ($WL_N$) |
| --- | --- | --- | --- | --- |
| P1' | Vpgm + F (row1) | Vpgm + F(row2) | ... | Vpgm + F(rowN) |
| P2' | Vpgm + ΔVt + F (row1) | Vpgm + ΔVt + F(row2 ) | ... | Vpgm + ΔVt + F(rowN) |
| P3' | Vpgm + 2ΔVt + F(row1) | Vpgm + 2ΔVt + F(row2) | ... | Vpgm + 2ΔVt + F(rowN) |
| P4' | Vpgm + 3ΔVt + F (row1) | Vpgm + 3ΔVt + F(row2) | ... | Vpgm + 3ΔVt + F(rowN) |
| P5' | Vpgm + 4ΔVt + F (row1) | Vpgm + 4ΔVt + F(row2) | ... | Vpgm + 4ΔVt + F(rowN) |
| P6' | Vpgm + 5ΔVt + F (row1) | Vpgm + 5ΔVt + F(row2) | ... | Vpgm + 5ΔVt + F(rowN) |
| P7' | Vpgm + 6ΔVt + F (row1) | Vpgm + 6ΔVt + F(row2) | ... | Vpgm + 6ΔVt + F(rowN) |
| P8' | Vpgm + 7ΔVt + F(row1) | Vpgm + 7ΔVt + F(row2) | ... | Vpgm + 7ΔVt + F(rowN) |

Figure 6:
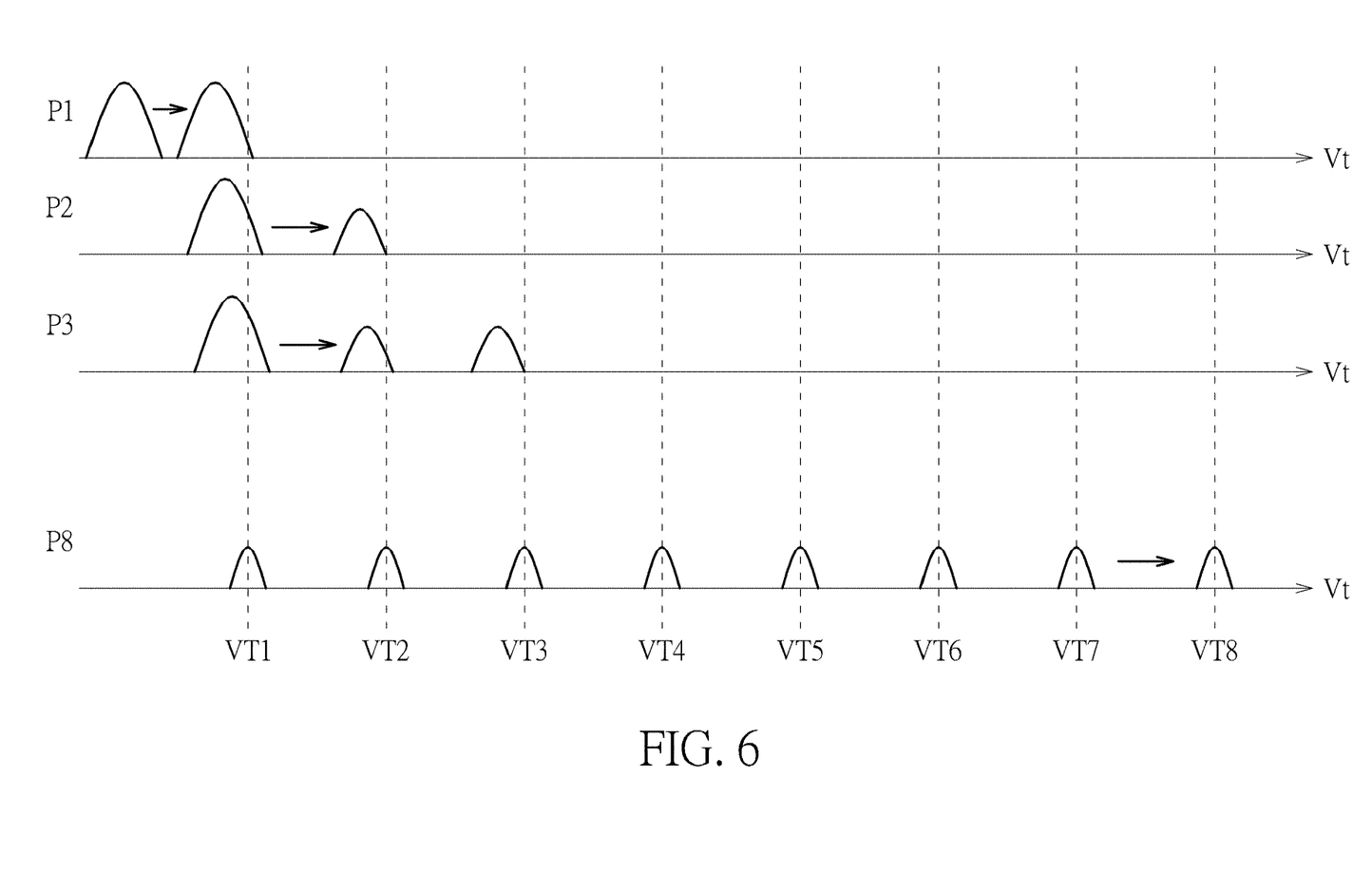
FIG. 6 is a diagram illustrating the threshold voltage distribution of the memory cells after performing the present program method according to an embodiment of the present invention.

In step 450, the plurality of compensated program voltage pulses are outputted to the specific program block for programming the corresponding memory cells to the predetermined signal level. FIG. 6 is a diagram illustrating the threshold voltage distribution of the memory cells after performing the present program method according to an embodiment of the present invention. For illustrative purpose, it is also assumed that the first row of memory cells $PX_{11}$-$PX_{1N}$ are programmed to eight threshold voltages VT1-VT8 by the column driving signals $SC_1$-$SC_N$ and that the column driving signals $SC_1$-$SC_N$ include the compensated program voltage pulses P1'-P8' having different levels as depicted in Table 1. Since the compensated program voltage pulses adopted in the present program method are associated the threshold voltage variations F(row1)-F(rowN) of the plurality of memory cells, different degrees of interferences encountered by the memory cells may be compensated accordingly. This way, after sequentially applying the compensated program voltage pulses P1'-P8', the first row of memory cells $PX_{11}$-$PX_{1N}$ may be programmed to the threshold voltages VT1-VT8 accurately.

In conclusion, the present invention provides a method of programming an MLC memory device and a related MLC memory device. First, a plurality of initial program voltage pulses with increasing voltage levels may be provided using ISPP. Next, a plurality of compensated voltage pulses may be provided by adjusting the plurality of initial program voltage pulses according to the threshold voltage variations of the plurality of memory cells in a specific program block, thereby improving program interferences.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of programing a multi-level cell (MLC) memory device, comprising:
   measuring a disturb characteristic of a program block in the MLC memory device, wherein the program block includes a plurality of memory cells, the disturb characteristic of a first memory cell in the program block is associated with an inter-cell interference between the first memory cell and at least a second memory cell in the program block during a programming operation, and the first memory cell and the second memory cell are neighboring memory cells in the program block;
   acquiring threshold voltage variations of the plurality of memory cells according to the disturb characteristic of the program block;
   determining P initial program voltage pulses associated with a predetermined signal level, wherein:
      a level of an $p^{th}$ initial program voltage among the P initial program voltages is equal to a sum of an initial program voltage value and p times a unit voltage increment;
      P is an integer larger than 1; and
      p is a positive integer not larger than P;
   providing P compensated program voltage pulses by adjusting the P initial program voltage pulses according to the threshold voltage variations of the plurality of memory cells, wherein a level of an $p^{th}$ compensated program voltage among the P compensated program voltages is equal to a sum of the initial program voltage value, p times the unit voltage increment and a threshold voltage variation of the plurality of memory cells when programed to the predetermined signal level; and
   programming the plurality of memory cells to the predetermined signal level by outputting the plurality of compensated program voltage pulses to the program block.

2. The method of claim 1, wherein a control end of each memory cell is coupled to a same word line in the MLC memory device.

3. The method of claim 2, wherein the disturb characteristics of the program block are determined based on a predetermined program distribution of the memory cells coupled to each word line.

4. The method of claim 1, further comprising:
   providing the P compensated program voltage pulses by adjusting peak values of the P initial program voltage pulses according to the threshold voltage variations of the plurality of memory cells.

5. The method of claim 1, wherein:
   the P initial program voltage pulses include a $1^{st}$ initial program voltage pulse to a $p^{th}$ initial program voltage pulse;
   the P compensated program voltage pulses include a $1^{st}$ compensated program voltage pulse to a $P^{th}$ compensated program voltage pulse corresponding to the $1^{st}$ initial program voltage pulse to the $p^{th}$ initial program voltage pulse, respectively;
   peak values of the $1^{st}$ initial program voltage pulse to the $P^{th}$ initial program voltage pulse increase sequentially; and peak values of the 1$^{st}$ compensated program voltage pulse to the p$^{th}$ compensated program voltage pulse increase sequentially; and P is an integer larger than 1.

6. The method of claim 5, further comprising:

programming the plurality of memory cells to the predetermined signal level by sequentially outputting the 1$^{st}$ compensated program voltage pulse to the p$^{th}$ compensated program voltage pulses to the program block.

7. The method of claim 1, further comprising:

outputting a plurality of verify voltage pulses to the program block for verifying whether the plurality of memory cells have been programmed to the predetermined signal level.

8. A multi-level cell (MLC) memory device, comprising:

a memory array comprising M columns and N rows of memory cells, wherein M and N are integers larger than 1; and a processing circuit configured to:
 acquire threshold voltage variations of each row of memory cells among the N rows of memory cells according to a disturb characteristic of each row of memory cells, wherein the disturb characteristic of a first memory cell in the memory array is associated with an inter-cell interference between the first memory cell and at least a second memory cell in the memory array during a programming operation, and the first memory cell and the second memory cell are neighboring memory cells in the memory array;
 determine P initial program voltage pulses associated with a predetermined signal level for an operation to program an n$^{th}$ row of memory cells among the N rows of memory cells to the predetermined signal level, wherein n is a positive integer not larger than N;
 provide P compensated program voltage pulses by adjusting the P initial program voltage pulses according to the threshold voltage variation of the n$^{th}$ row of memory cells; and
 program the n$^{th}$ row of memory cells to the predetermined signal level by outputting the plurality of compensated program voltage pulses to the n$^{th}$ row of memory cells, wherein:
  a level of an p$^{th}$ initial program voltage among the P initial program voltages is equal to a sum of an initial program voltage value and p times a unit voltage increment;
  a level of an p$^{th}$ compensated program voltage among the P compensated program voltages is equal to a sum of the initial program voltage value, p times the unit voltage increment and a threshold voltage variation of the plurality of memory cells when programed to the predetermined signal level;
  P is an integer larger than 1; and
  p is a positive integer not larger than P.

9. The MLC memory device of claim 8, wherein the processing circuit is further configured to:

provide the P compensated program voltage pulses by adjusting peak values of the P initial program voltage pulses according to the threshold voltage variations of the n$^{th}$ row of memory cells.

10. The MLC memory device of claim 8, wherein the processing circuit is further configured to:

adjust the P compensated program voltage pulses based on a predetermined program distribution of each row of memory cells among the N rows of memory cells.

11. The MLC memory device of claim 8, wherein:

the P initial program voltage pulses include a 1$^{st}$ initial program voltage pulse to a p$^{th}$ initial program voltage pulse;

the P compensated program voltage pulses include a 1$^{st}$ compensated program voltage pulse to a p$^{th}$ compensated program voltage pulse corresponding to the 1$^{st}$ initial program voltage pulse to the p$^{th}$ initial program voltage pulse, respectively;

peak values of the 1$^{st}$ initial program voltage pulse to the P$^{th}$ initial program voltage pulse increase sequentially; and peak values of the 1$^{st}$ compensated program voltage pulse to the p$^{th}$ compensated program voltage pulse increase sequentially.

12. The MLC memory device of claim 8, wherein the processing circuit is further configured to:

program the n$^{th}$ row of memory cells to the predetermined signal level by sequentially outputting the 1$^{st}$ compensated program voltage pulse to the p$^{th}$ compensated program voltage pulses to the n$^{th}$ row of memory cells.

13. The MLC memory device of claim 8, wherein the processing circuit is further configured to:

output a plurality of verify voltage pulses to the n$^{th}$ row of memory cells for verifying whether the n$^{th}$ row of memory cells have been programmed to the predetermined signal level.

* * * * *